United States Patent [19]
Bartkowiak et al.

[11] Patent Number: 5,507,037
[45] Date of Patent: Apr. 9, 1996

[54] APPARATUS AND METHOD FOR DISCRIMINATING SIGNAL NOISE FROM SATURATED SIGNALS AND FROM HIGH AMPLITUDE SIGNALS

[75] Inventors: John G. Bartkowiak; Safdar M. Asghar, both of Austin, Tex.

[73] Assignee: Advanced Micro Devices, Inc., Sunnyvale, Calif.

[21] Appl. No.: 152,316

[22] Filed: Nov. 3, 1993

Related U.S. Application Data

[63] Continuation-in-part of Ser. No. 887,076, May 22, 1992.
[51] Int. Cl.[6] ............................................. H04B 1/10
[52] U.S. Cl. ............................................. 455/296; 375/346
[58] Field of Search .................................. 455/222, 218, 455/220, 225, 296, 303, 306, 307; 375/346, 349, 351

[56] References Cited

U.S. PATENT DOCUMENTS

| | | | |
|---|---|---|---|
| 4,074,201 | 2/1978 | Lennon | 455/222 |
| 4,411,021 | 10/1983 | Yoakum | 455/222 |
| 4,648,126 | 3/1987 | Toffolo | 455/222 |
| 4,648,127 | 3/1987 | Jongepier | 455/222 |
| 4,907,293 | 3/1990 | Ueno | 455/296 |

*Primary Examiner*—Reinhard J. Eisenzopf
*Assistant Examiner*—Thanh Le
*Attorney, Agent, or Firm*—Foley & Lardner

[57] ABSTRACT

An apparatus and method are provided for discriminating noise in a received signal. The apparatus comprises a first signal processing means, a second signal processing means, a threshold generating means for generating a threshold value. The first signal processing means generates iteration signal samples and predicted iteration signal samples, compares the iteration signal samples and predicted signal samples to generate a predicted error parameter. The second signal processing means generates a threshold adjustment value based on generated successive iteration signal samples. A logic means logically treats the prediction error parameter, the threshold adjustment value and the threshold value to generate a noise indication value.

37 Claims, 3 Drawing Sheets

APPARATUS AND METHOD FOR DISCRIMINATING SIGNAL NOISE FROM SATURATED SIGNALS AND FROM HIGH AMPLITUDE SIGNALS

CROSS REFERENCE TO RELATED APPLICATIONS

This application is a continuation-in-part of application Ser. No. 07/887,076, filed May 22, 1992.

The following applications contain subject matter similar to the subject matter of this application:

U.S. application Ser. No. 07/887,470, filed May 22, 1992, now U.S. Pat. No. 5,369,791, issued Nov. 29, 1994, "Apparatus and Method for Discriminating and Suppressing Noise within an Incoming Signal".

U.S. application Ser. No. 07/887,469, filed May 22, 1992, now U.S. Pat. No. 5,299,233, issued Mar. 29, 1994, entitled "Apparatus for Attenuating a Received Signal in Response to Presence of Noise".

BACKGROUND OF THE INVENTION

In certain types of communications systems, such as systems employed with wireless telephone systems, information conveyed via analog signalling is received by a receiver in a series of encoded representations of information, generally in the form of a series of "1"'s and "0"'s established via frequency shift keying (FSK) at high frequency. Such transmissions may be subject to reflection such as from buildings and other objects in the transmission path, so there are sometimes radio frequency (RF) signals arriving at a receiver which are time-delayed with respect to other received signals in a manner which may interrupt or distort reception. As a result, the demodulator (or decoder) of the receiver may erroneously convert received signals, thereby becoming unstable and producing interference. Such interference is generally perceived by a user of such a system in the form of popping or clicking sounds or other distracting noises.

It is common in the communications industry to compensate for interference or other noise by providing a feedback circuit with a delay whereby one can estimate the noise component of the received signal, generate a duplicate approximation of the noise component, and subtract that approximate noise component from the original signal to eliminate the noise received in the incoming signal. However, an industry standard published for wireless telephones and similar systems requires that no delays be introduced in such systems; i.e., the system must be what is commonly known as a real-time system. Consequently, a solution for eliminating noise in such a system must likewise be a real-time system.

Real-time noise discrimination and suppression systems have been designed to quickly discriminate and suppress noise in an incoming signal and to effect muting in a manner which does not prevent understanding received speech when the invention mistakenly triggers on true speech. However, when using these noise detection systems, it is possible that high amplitude tones and saturated or clipped speech generated in the transmitter and encoded and sent to the receiver are decoded by the receiver. If the encoding and decoding method is a method such as Adaptive Differential Pulse Code Modulation ("ADPCM"), the decoder may reconstruct the signal in such a way that the decoder output signal is saturated for high amplitude tones and severely clipped for encoded signals that were slightly clipped.

Where the decoder output is saturated or clipped, the noise detection algorithm can falsely trigger the noise suppression algorithm and erroneously mute good tones or speech. Such false triggers can be avoided by reducing the programmed threshold value of the noise detection algorithm. However, reducing the threshold value may reduce the performance of the noise discrimination and detection system in the presence of noise bursts. Such noise bursts may be missed by the system, causing annoying noise signals to be conveyed to the user.

SUMMARY OF THE INVENTION

The invention provides an apparatus for discriminating noise in a received signal. The apparatus includes a first signal processing means for receiving the received signal and generating a prediction error parameter. The apparatus further includes a second signal processing means for receiving the received signal and generating a threshold adjustment value. The apparatus still further includes a threshold generating means for generating a threshold value. The apparatus still further includes a logic means operatively connected with the first signal processing means, the second signal processing means and the threshold generating means for logically treating the prediction error parameter, the threshold adjustment value and the threshold value to generate a noise indication value.

The first signal processing means may include first iteration processing means for receiving a first plurality of successive samples of said received signal and generating a first iteration signal, a prediction means operatively connected with said first iteration processing means for receiving said first iteration signal and predicting a next sample value of the first iteration signal, and a comparing means operatively connected with said first iteration processing means and with said prediction means for comparing said first iteration signal with said next sample value and generating the prediction error parameter. The second signal processing means may include a second iteration processing means for receiving a second plurality of successive samples of said received signals and generating a second iteration signal responsive to the received signal, and may further include a threshold adjusting means operatively connected with said second iteration processing means for generating a threshold adjustment factor responsive to the second iteration signal.

The invention further provides an apparatus for discriminating noise in a received signal. The apparatus includes a first signal processing means for receiving the received signal and generating a prediction error parameter. The first signal processing means includes a first iteration processing means for generating a first iteration signal, a prediction means for predicting a next sample value of the first iteration signal, and a comparing means for generating the prediction error parameter. The first iteration processing means receives a first plurality of successive samples of the received signal and generates a plurality of first iteration signal samples, each successive first iteration signal sample representing a value of a first predetermined number of the first plurality of successive samples of the received signal. The prediction means is operatively connected with the first iteration processing means and receives the plurality of first iteration signal samples and generates a plurality of predicted first iteration signal samples. At least one successive predicted first iteration signal sample of the plurality of predicted first iteration signal samples is used for predicting a next successive first iteration signal sample. The comparing means is operatively connected with the first iteration processing means and the prediction means and compares the successive first iteration signal samples with the predicted first iteration signal samples, generating the prediction error parameter based upon the comparison.

The apparatus further includes a second signal processing means for receiving the received signal and generating a threshold adjustment value. The second signal processing means includes a second iteration processing means for generating a second iteration signal and a threshold adjusting means for generating a threshold adjustment factor. The second iteration processing means receives a second plurality of successive samples of the received signal and generates a plurality of second iteration signal samples. Each successive second iteration signal sample represents a value of a second predetermined number of the second plurality of successive samples of the received signal. The threshold adjusting means is operatively connected to the second iteration processing means and generates the threshold adjustment value in response to selected successive second iteration signal samples.

The apparatus still further includes a threshold generating means for generating a threshold value. The apparatus still further includes a logic means operatively connected with the first signal processing means, with the second signal processing means and with the threshold generating means for logically treating the prediction error parameter, the adjustment value, and the threshold value to generate a noise indication value.

The invention still further provides a method for discriminating noise in a received signal. The method includes generating a first plurality of first iteration signal samples, at least one successive first iteration signal sample representing a value of a first plurality of successive samples of the received signal. The method further includes generating a second plurality of predicted first iteration signal samples, at least one successive predicted first iteration signal sample predicting a next successive first iteration signal sample. The method still further includes comparing the successive first iteration signal samples with the predicted first iteration signal samples and generating a prediction error parameter based upon the comparison. The method still further includes generating a plurality of second iteration signal samples, at least one successive second iteration signal sample representing a value of a second predetermined number of the second plurality of successive samples of the received signal. The method still further includes generating a threshold adjustment value based upon selected successive second iteration signal samples. The method still further includes generating a threshold value. The method still further includes providing a logic means for logically treating the prediction error parameter, the threshold adjustment value and the threshold value to generate a noise indication value according to a predetermined logical relationship among the prediction error parameter, the threshold adjustment value and the threshold value.

It is, therefore, an advantage of the present invention to provide an adaptive threshold system for discriminating signal noise from saturated signals and from high amplitude signals.

A further advantage of the present invention is to allow the clipped speech and high amplitude tones to pass through the receiver without muting while still discriminating and suppressing noise bursts.

Yet a further advantage of the present invention is avoidance of false triggering of the noise suppression algorithm without reducing the programmed threshold value of the noise detection algorithm in a real-time noise discrimination and suppression system.

Further advantages and features of the present invention will be apparent from the following specification and claims when considered in connection with the accompanying drawings illustrating the preferred embodiment of the present invention.

DETAILED DESCRIPTION OF THE DRAWINGS

For purposes of clarity and ease in understanding the present invention, like elements will be identified by like reference numerals in the various drawings.

DETAILED DESCRIPTION OF THE INVENTION

Figure 1:
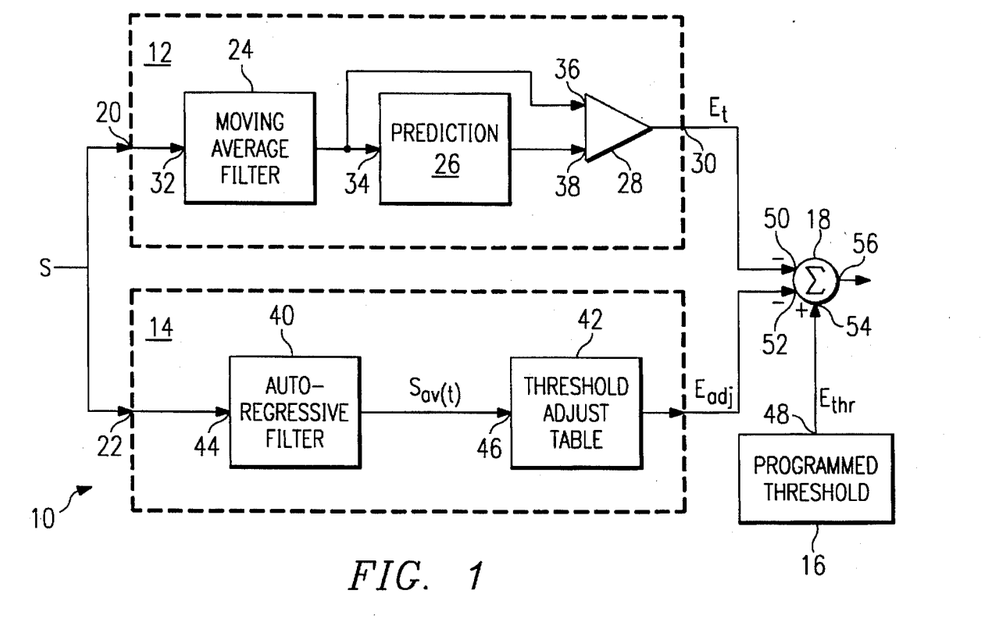
FIG. 1 is a schematic block diagram of the preferred embodiment of the apparatus of the present invention.

FIG. 1 is a schematic block diagram of the preferred embodiment of the present invention. In FIG. 1, an apparatus 10 for discriminating signal noise from saturated signals and from high amplitude signals is illustrated as including a first signal processing means 12, a second signal processing means 14, a threshold generating means 16 and a logic means 18.

The apparatus 10 may be used in a wireless phone system, such as a phone system having no cord connecting the phone receiver and a base unit, the base unit being configured to receive telephone signals by wire or other means. In such wireless telephone systems, the input speech received at an input 20 of first processing means 12 and input 22 of second processing means 14 is already band limited to 4 KHz prior to reception by the receiving system. This input speech can be received from other sources in other systems, such as recording machines, and may be in linear format or compressed form, having been compressed according to any of several compression algorithms. Speech which is in compressed form (e.g., pulse code modulated or PCM, adaptive differential pulse code modulated or ADPCM, or differential pulse code modulated or DPCM, or the like) passes through a normal decoder for the appropriate respective coding system and is then introduced into the audio receiver as linear data. Noise detection preferably occurs after the received signal is decoded. No delay need be introduced into the receiving system if such delay is critical to performance or if industry standards preclude any delay. However, if a small amount of delay is used, the early part of a noisy passage of signal can be removed which improves performance.

An incoming signal s is received from the output of a signal decoder (not shown in FIG. 1) by first signal processing means 12 at input 20. First signal processing means 12 includes a first iteration processing means for generating a first iteration signal, such as moving average filter 24, a prediction means for predicting a next sample value of the first iteration signal, such as prediction unit 26, and a comparing means 28 for generating a prediction error parameter, $E_t$, at output 30 of the first signal processing means 12.

The moving average filter 24 receives at its input 32 a first plurality of successive samples of the received incoming signal s. The successive samples are preferably successive in time but may be either directly successive (uninterrupted) or indirectly successive (with some samples discarded). Moving average filter 24 generates a first plurality of iteration signal samples. Each successive iteration signal sample represents a value of a predetermined number of the plurality of successive samples of the incoming signal s. The value of the predetermined number of the plurality of successive samples of the received signal may be an average of the number of the plurality of successive samples of the input signal s.

Prediction unit 26 receives at input 34 the plurality of iteration signal samples generated by moving average filter 24 and generates a plurality of predicted iteration signal samples. Each successive predicted iteration signal sample of the plurality of predicted iteration signal samples is used to predict the next successive iteration signal sample.

Comparing means 28 receives at first input 36 the plurality of iteration signal samples generated by the moving average filter 24. Comparing means 28 also receives at second input 38 the plurality of predicted iteration signal samples generated by prediction unit 26. The comparing means 28 compares the plurality of iteration signal samples with the predicted iteration signal samples. Preferably, the comparison involves a respective successive iteration signal sample and a respective predicted iteration signal sample which are preferably substantially synchronous. Based on this comparison, comparing means 28 generates a prediction error parameter $E_t$ based upon the comparison. The prediction error parameter $E_t$ is supplied to output 30 of the first signal processing means 12.

The operation of first signal processing means 12 will be discussed in detail in connection with FIG. 2.

The second signal processing means 14 preferably includes a second iteration processing means for generating a second iteration signal, such as auto-regressive filter 40, and a threshold adjusting means for generating a threshold adjustment factor such as threshold adjust table 42.

The auto-regressive filter 40 receives at input 44 a second plurality of successive samples of the input signal s. The successive samples are preferably successive in time but may be either directly successive (uninterrupted) or indirectly successive (with some samples discarded). Preferably, the second plurality of successive signal samples received by auto-regressive filter 40 is the same as the first plurality of successive signal samples received by moving average filter 24. Preferably, auto-regressive filter 40 has a time constant that is longer than the time constant of moving average filter 24.

Auto-regressive filter 40 generates a second plurality of iteration signal samples. Each successive iteration signal sample represents a value of a predetermined number of the plurality of successive samples of the input signal s. Preferably, the predetermined number of successive samples used by auto-regressive filter 40 is greater than the predetermined number of successive samples used by moving average filter 24. The auto-regressive filter 40 produces an output signal $S_{av}(t)$ according to the following equation:

$$S_{av}(t) = a|x(t)| + bS_{av}(t-1)$$

where:

$|x(t)|$ is the modulus or absolute value of the input signal;

a and b are the filter coefficients of auto-regressive filter 40; and $S_{av}(t)$ is the output of auto-regressive filter 40 at time t.

Preferably, filter coefficients a and b define a relatively long time constant.

The output signal $S_{av}(t)$ is supplied to an input 46 of threshold adjust table 42. Threshold adjust table 42 generates a threshold adjust value $E_{adj}$ in response to the generated by auto-regressive filter 40.

Preferably, threshold adjust table 42 includes a look-up table. The output $S_{av}(t)$ of auto-regressive filter 40 is used as the input to the look-up table of adjustment values. See Table I for exemplary values.

TABLE I

| Step Number | Autoregressive Signal Level (Decimal) | $E_{thr}$ Adjustment (dB's) |
|---|---|---|
| 1 | 0–79 | −0.75 |
| 2 | 80–177 | −1.5 |
| 3 | 178–245 | −2.25 |
| 4 | 246–299 | −3.0 |
| 5 | 300–348 | −3.75 |
| 6 | 349–399 | −4.5 |
| 7 | 400–2047 | −5.25 |

Thus, the exemplary threshold adjust table 42 of Table I operates in a seven step range where each step reduces the $E_{thr}$ value by 0.75 dB per step.

Apparatus 10 for discriminating signal noise further includes a threshold generating means for generating a threshold value such as programmed threshold unit 16. The generated threshold value $E_{thr}$ is provided to output 48 of the program threshold unit 16.

Apparatus 10 still further includes logic means 18 for logically treating the prediction error parameter $E_t$, the threshold adjustment value $E_{adj}$, and the threshold value $E_{thr}$ to generate a noise indication value. Logic means 18 has a first input 50 for receiving the prediction error parameter $E_t$, a second input 52 for receiving the threshold adjustment value $E_{adj}$, and a third input 54 for receiving the threshold value $E_{thr}$. The logic means 18 also has an output 56 for providing the noise indication value. Preferably, the logic means 18 generates the noise indication value when the prediction error parameter is less than the difference between the threshold value and the threshold adjustment value, or when $E_t < E_{thr} - E_{adj}$.

As can be seen, protection against false triggering of the apparatus 10 is provided by dynamically adapting the programmed threshold value $E_{thr}$ downward by adjusting $E_{adj}$ so that $E_t$ does not become less than the $(E_{thr} - E_{adj})$ value. The output $S_{av}(t)$ of the auto-regressive filter 40 is used as the input to a look-up table of adjustment values which are subtracted from the programmed $E_{thr}$ value by logic means 18. In this manner, the programmed threshold is adjusted downward as the modulus of the input signal level $|x(t)|$ increases. Since the amplitude of an input clipped speech signal or a high amplitude tone still varies relatively slowly with time, the threshold adjustment made by the autoregressive filter 40 moves slowly with the output signal $S_{av}(t)$ of auto-regressive filter 40 and prevents the first signal processing means 12 from triggering.

However, when burst noise is present in the received signal s, the amplitude of the received signal s can rise very rapidly. Since the auto-regressive filter 40 preferably has a long time constant, the output of the auto-regressive filter 40 cannot follow the rapid change in the input signal as quickly as can the moving average filter 24. Thus, the adaptive adjustment of the threshold downward is not fast enough to prevent the apparatus 10 from triggering on the noise burst. The noise burst is muted whereas clipped speech or high amplitude tones are passed through the apparatus 10 unaffected.

Figure 2:
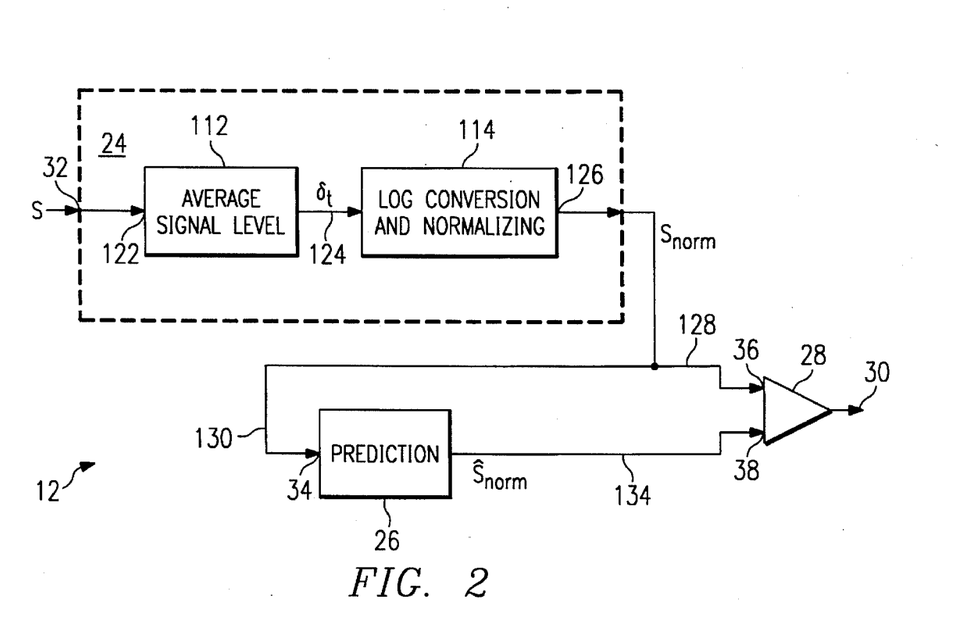
FIG. 2 is a schematic block diagram of an alternative embodiment of the first signal processing means of FIG. 1.

FIG. 2 is a schematic block diagram of an alternate embodiment of the apparatus of the first signal processing means of FIG. 1. In FIG. 2, a first signal processing means 12 is illustrated as including moving average filter 24, a prediction unit 26, and a comparator unit 28. Moving average filter 24 includes signal level averaging unit 112 and log conversion and normalizing unit 114.

An incoming signal s is received from the output of a signal decoder (not shown in FIG. 2) by signal level averaging unit 112 at input 122. Signal level averaging unit 112 calculates an average signal level $\delta_t$, according to the relationship:

$$\delta_t = \frac{1}{n} \sum_{i=1}^{n} |s_i| \qquad [\text{Eq. 1}]$$

where $\delta_t$=average signal level, $|s_i|$=absolute value of the signal level of the $i^{th}$ sample of the incoming signal s, and n=number of samples.

Signal level averaging unit 112 averages the absolute value of incoming signal s over n samples at a sampling rate of 8 KHz.

During normal speech, the output of signal level averaging unit 112 varies slowly so that its output can be predicted accurately. However, when incoming signal s is noisy, large errors occur in the prediction of average signal level $\delta_t$. Such presence of noise in incoming signal s can thus be detected whenever the inverse of prediction error is less than a predetermined threshold level (or, conversely, whenever prediction error is greater than a predetermined threshold level). The choice of threshold level can affect the performance of first signal processing means 12 because, if the threshold is set too high, first signal processing means 12 triggers on true speech, and if the threshold is set too low, noise can be missed.

Signal level averaging unit 112 provides its output $\delta_t$ to log conversion and normalizing unit 114 via a line 124. Incoming signal s is preferably received as a series of "1"s and "0"s in the form of a frequency shift keyed (FSK) signal, converted to linear data by a decoder before input to signal level averaging unit 112.

Log conversion and normalizing unit 114 performs a conversion of average signal level $\delta_t$, according to the known relationship:

$$S_{norm} = 10 \log_{10} \left( \frac{\delta_t}{\delta_{max}} \right) \qquad [\text{Eq. 2}]$$

where $S_{norm}$=average signal level normalized with respect to maximum signal level, $\delta_t$=average signal level, and $\delta_{max}$=maximum expected signal level.

Thus, log conversion and normalizing unit 114 provides at an output 126 the quantity $S_{norm}$ (expressed in decibels (db)) representing average signal level $\delta_t$ normalized with respect to maximum signal level $\delta_{max}$ expected to be received by first signal processing means 12. Preferably, $\delta_{max}$=8192.

The implementations of Equations (1) and (2) are preferably simplified for use in a binary arithmetic system and it is desirable that the division functions be removed for convenience, efficiency, and speed in calculation.

Each incoming signal sample $s_i$ is a 16-bit 2's complement number arranged in a format shown below where the arithmetic mask is 19-bit:

| Bit No. | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
|  |  |  |  | S | 15 | 14 | 13 | 12 | 11 | 10 | 9 | 8 | 7 | 6 | 5 | 4 | 3 | 2 | 1 | where "S" is the sign bit and there are 15 magnitude bits, "bits 15—1".

Equation (1) requires that the "modulus", or absolute value, of the signal level, or signal strength, of each incoming signal sample $s_i$ be generated and added to the previous (n—1) samples of $|s_i|$. The value of n is preferably chosen to be 8 since it represents $2^3$ and is therefore easily handled by a binary number system. Eight samples can be accumulated in an arithmetic logic unit (ALU) in the number format shown above without overflow, and an averaging filter which accommodates n=8 has demonstrated good performance in fulfilling the requirements of signal level averaging unit 112.

Thus, when average signal level $\delta_t$ is finally accumulated, it resides in an ALU in the following accumulated format:

| Bit No. | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
|  | S | 18 | 17 | 16 | 15 | 14 | 13 | 12 | 11 | 10 | 9 | 8 | 7 | 6 | 5 | 4 | 3 | 2 | 1 |

|⸺⸺⸺⸺⸺ most significant 16 bits ⸺⸺⸺⸺⸺|

Equation (2) may be simplified to express $S_{norm}$ in a base 2 logarithm format for more straightforward treatment using a binary system in the form of Equation (3) as shown below:

$$S_{lnorm} = 10\log_{10}\frac{\delta_t}{\delta_{max}} = K(\log_2 \delta_t - \log_2 \delta_{max}), \qquad [\text{Eq. 3}]$$

$$\text{where } K = 10\log_{10} 2$$

$$= K(\log_2 \delta_t - K_1),$$

$$\text{where } K_1 = \log_2 \delta_{max}$$

$\delta_{max}$ is preferably chosen as 8192=$2^{13}$, since in this exemplary system 8192 is the maximum signal level expected in a normal decoder output. Any signal in excess of 8192 is, thus, treated as an overloaded signal (i.e., saturated speech input or noise).

Equation (3) simplifies the operation of first signal processing means 12, especially since it avoids division. K is a scaling factor, which can be ignored, and $K_1$ is a constant which may be prestored and, therefore, does not require calculation. The most significant 16 bits of the ALU in the accumulated format described above are applied to $\log_2$ hardware (which is available as a known circuit block); the output of the log$_2$ hardware is an 11-bit plus implied positive sign (12-bit) value stored in a 12-bit format as shown below:

```
Bit No. 18 17 16 15 14 13 12 11 10 9 8 7 6 5 4 3 2 1 0
         0  X  X  X  X  X  X  X  X  X X X X 0 0 0 0
        |—————————————————————————————|
              most significant 16 bits
            Output of log2 Hardware circuit
```

This log$_2$ value is a signed, 4-bit exponent, 7-bit mantissa parameter where the 4-bit exponent represents the position of the most significant "1" in the 16-bit value $\delta_t$.

The prestored constant $K_1$ may then be subtracted from the output $\delta_t$ of signal level averaging unit 112 by log conversion and normalizing unit 114 to generate normalized average signal level $S_{norm}$.

Normalized average signal level $S_{norm}$ is conveyed via a line 128 to a first input 36 of comparator unit 28, and is conveyed via a line 130 to an input 34 of prediction unit 26.

The predicted value of the normalized average signal level $\hat{S}_{norm}$ is determined according to the relationship:

$$\hat{S}_{norm} = \sum_{i=1}^{m} Y_i S_{norm}^{t-i} \qquad [\text{Eq. 4}]$$

where m=4 and $Y_i$ are predefined constants. The four past scaled values of $S_{norm}$ are represented by $Y_i S_{norm}^{t-i}$ and are accumulated in prediction unit 26. Equation (4) may be executed employing an 8×16-bit parallel multiplier where the most significant 16-bits of the $S_{norm}$ parameter (in the 12-bit format described above) are applied to the 16-bit input of the multiplier and the $Y_i$ parameters are (prestored as 8-bit signed coefficients) applied to the 8-bit input of the multiplier. The output of the multiplier is preferably in the 12-bit format described above (and in log$_2$ format).

Prediction unit 26 conveys the value of $\hat{S}_{norm}$ via a line 134 to a second input 38 of comparator unit 28. The apparatus by which prediction unit 26 calculates the value $\hat{S}_{norm}$ will be discussed in greater detail hereinafter in connection with FIG. 3.

Comparator unit 28 calculates a prediction error parameter $E_t$, preferably in decibels (db), according to the relationship:

$$E_t = 10\log_{10} \frac{(S_{norm})^2}{(S_{norm} - \hat{S}_{norm})^2} \qquad [\text{Eq. 5}]$$

This may be simplified to:

$$E_t = K_2(\log_2 S_{norm} - \log_2[S_{norm} - \hat{S}_{norm}]) \qquad [\text{Eq. 6}]$$

Execution of Equation (6) requires only two subtractions and two log$_2$ functions, thus simplifying execution of Equation (6) by eliminating any division operations. $K_2=20\log_{10}2$, and is a constant which can be ignored in the preferred exemplary implementation.

First signal processing means 12 is based upon a signal level prediction and upon an assumption that during normal speech the average signal level varies relatively slowly but channel noise often causes the decoder (from which incoming signal s is received by first signal processing means 12) to become unstable resulting in a large increase in decoded signal level in a much shorter time than is experienced when incoming signal s contains speech information. It is this rapid and large increase in level which is perceived as unpleasant clicks or pops by a user.

During normal speech, the relatively slowly-varying signal level of incoming signal s can be predicted relatively accurately. However, when the decoder becomes unstable (as when noise is present) this signal is not predictable and results in a large error in the predictor output. First signal processing means 12 detects the onset of a noise burst whenever the prediction error parameter $E_t$ is less than a predetermined threshold. The choice of the threshold directly affects performance and responsiveness of the system, and is generally determined empirically.

Figure 3:
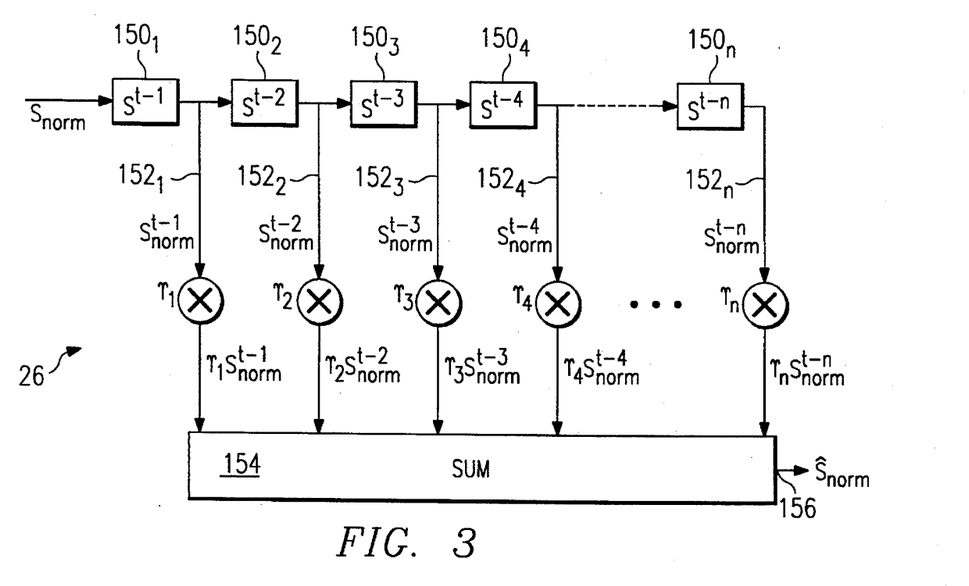
FIG. 3 is a schematic block diagram of a representative embodiment of the prediction unit of the first signal processing means of FIG. 2.

FIG. 3 is a schematic block diagram of a representative embodiment of the prediction unit of the first signal processing means of FIG. 2. In FIG. 3, a prediction unit 26 is illustrated as a multi-stage digital filter comprising a plurality of delay units $150_1$, $150_2$, $150_3$, $150_4$, . . . $150_n$. Each delay unit $150_i$ delays the received signal $S_{norm}$ (normalized average signal level) by an additional time period so that an output line $152_1$ conveys the received signal delayed one time period $S_{norm}^{t-1}$; output line $152_2$ conveys the received signal delayed by two time periods, $S_{norm}^{t-2}$; output line $152_3$ conveys the received signal delayed three time units, $S_{norm}^{t-3}$; output line $152_4$ conveys the received signal delayed by four time units, $S_{norm}^{t-4}$; and output line $152_n$ conveys the received signal delayed by n time units, $S_{norm}^{t-n}$.

Each of the respective output signals $S_{norm}^{t-i}$ conveyed by output lines $152_i$ are respectively multiplied by a scaling factor $Y_i$ so that output signal $S_{norm}^{t-1}$ is multiplied by scaling factor $Y_1$, output signal $S_{norm}^{t-2}$ is multiplied by scaling factor $Y_2$, output signal $S_{norm}^{t-3}$ is multiplied by scaling factor $Y_3$, output signal $S_{norm}^{t-4}$ is multiplied by scaling factor $Y_4$, and output signal $S_{norm}^{t-n}$ is multiplied by scaling factor $Y_n$. The resultant scaled output signals $Y_i S_{norm}^{t-i}$ are summed in a summer 154 which provides at an output 156 a predicted value $\hat{S}_{norm}$ for normalized average signal level $S_{norm}$ based upon a plurality of earlier samples $S_{norm}^{t-i}$ of $S_{norm}$.

Figure 4:
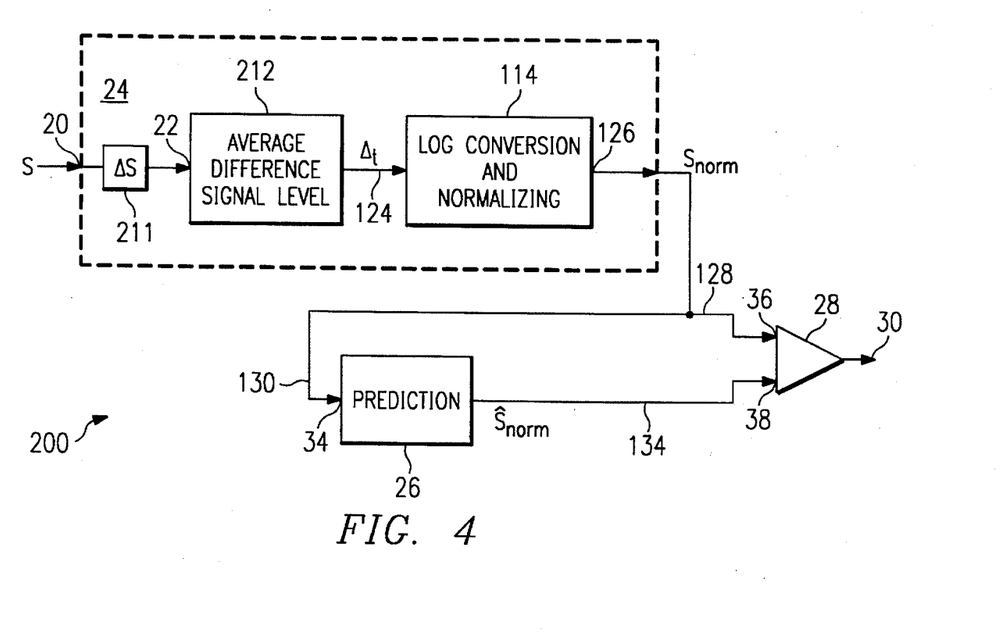
FIG. 4 is a schematic block diagram of the preferred embodiment of the first signal processing means of FIG. 1.

FIG. 4 is a schematic block diagram of the preferred embodiment of the first signal processing means of FIG. 1. In FIG. 4, an incoming signal s is received by a first signal processing means 200 from the output of a signal decoder (not shown in FIG. 4) by a signal difference sampling unit 211.

Signal difference sampling unit 211 provides an output which represents the difference between a current sample of incoming signal s with a previous sample of incoming signal s. When incoming signal s is sampled at regular intervals (i.e., at a constant sampling rate), then the difference output generated by difference sampling unit 211 is directly related to the rate of change, or slope, of the signal level of incoming signal s at each sampling. This rate of change of signal level is particularly useful in discriminating noise from communications signals, especially speech signals, since the slope of noise signals is significantly different from the slope of speech signals. Noise signals are very easily and, more important, very quickly distinguishable from speech signals by their slope. The difference signal output may, for example, be determined by an arrangement such as the device illustrated in FIG. 5.

Figure 5:
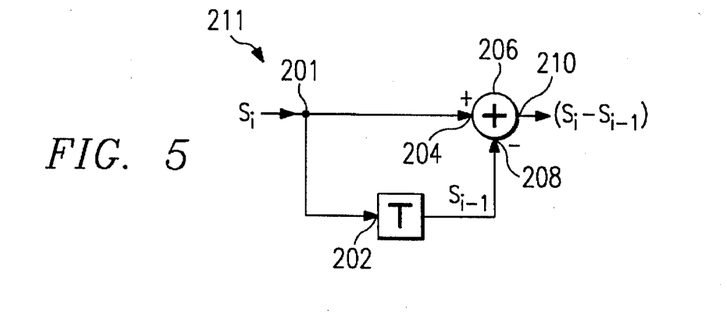
FIG. 5 is a schematic block diagram of details of a representative device suitable for use as the signal difference sampling unit of the preferred embodiment shown in FIG. 4 of the first signal processing means of FIG. 1.

FIG. 5 is a schematic block diagram of details of a representative device suitable for use as the signal difference sampling unit of the preferred embodiment of the first signal processing means illustrated in FIG. 4. In FIG. 5, an incoming signal sample $s_i$ is received at a juncture 201. Signal sample $s_i$ is applied to a delay unit 202 and to the positive node 204 of a summer 206. Delay unit 202 generates a delayed (preferably a 1-sample delay) signal sample $s_{i-1}$, and delayed signal sample $s_{i-1}$ is applied to a negative node 208 of summer 206. Summer 206 generates at an output 210 a difference signal $s_i - s_{i-1}$. Difference signal $s_i - s_{i-1}$ is received by signal difference level averaging unit 212 at input 22 (FIG. 4). Signal difference level averaging unit 212 calculates an average difference signal level $\Delta_t$, preferably according to the relationship:

$$\Delta_t = \frac{1}{n} \sum_{i=1}^{n} |s_i - s_{i-1}| \quad \text{[Eq. 7]}$$

where $\Delta_t$=average difference signal level, $|s_i-s_{i-1}|$=absolute value of the difference between the signal level of the $i^{th}$ sample of the incoming signal s and the $(i-1)^{th}$ sample of the incoming signals, and n=number of samples.

Signal difference level averaging unit 212 preferably averages the absolute value of difference signal level $(s_i-s_{i-1})$ over n samples at a sampling rate of 8 KHz.

During normal speech, the output of signal difference level averaging unit 212 varies slowly so that its output can be predicted accurately. However, when incoming signal s is noisy, large errors occur in the prediction of average difference signal level $\Delta_t$. Such presence of noise in incoming signal s can thus be detected whenever the inverse of prediction error is less than a predetermined threshold level (or, conversely, whenever prediction error is greater than a predetermined threshold level).

Returning to FIG. 4, signal difference level averaging unit 212 provides its output $\Delta_t$ to log conversion and normalizing unit 114 via a line 124. Average signal level $\Delta_t$ is provided to log conversion and normalizing unit 114 via a line 124. Incoming signal s is preferably received as a series of "1"'s and "0"'s in the form of a frequency shift keyed (FSK) signal, converted to linear data by a decoder before input to signal difference sampling unit 211.

Log conversion and normalizing unit 114 performs a conversion of average difference signal level $\Delta_t$, preferably according to the known relationship:

$$\Delta S_{norm} = 10\log_{10}\left(\frac{\Delta_t}{\Delta_{max}}\right) \quad \text{[Eq. 8]}$$

where $\Delta S_{norm}$=average difference signal level normalized with respect to maximum signal level, $\Delta_t$=average difference signal level, and $\Delta_{max}$=maximum expected difference signal level.

Thus, log conversion and normalizing unit 114 provides at an output 126 the quantity $\Delta S_{norm}$ (expressed in decibels (db)) representing average difference signal level $\Delta_t$ normalized with respect to maximum difference signal level $\Delta_{max}$ expected to be received by apparatus 200.

The implementations of Equations (7) and (8) are preferably simplified for use in a binary arithmetic system and it is desirable that the division functions be removed for convenience, efficiency, and speed in calculation. Equation (12) may be simplified to express $\Delta S_{norm}$ in a base 2 logarithm format for more straightforward treatment using a binary system in the form of Equation (13) as shown below:

$$\Delta S_{norm} = 10\log_{10}\frac{\Delta_t}{\Delta_{max}} = K(\log_2\Delta_t - \log_2\Delta_{max}), \quad \text{[Eq. 9]}$$

where $K = 10\log_{10}2$ $$= K(\log_2\Delta_t - K_1),$$

where $K_1 = \log_2\Delta_{max}$

Equation (9) simplifies the operation of apparatus 200, especially since it avoids division. K is a scaling factor, which can be ignored, and $K_1$ is a constant which may be prestored and, therefore, does not require calculation. The prestored constant $K_1$ may be subtracted from the output $\Delta_t$ of signal difference level averaging unit 212 by log conversion and normalizing unit 114 to generate normalized average difference signal level $\Delta S_{norm}$.

Normalized average difference signal level $\Delta S_{norm}$ is conveyed via a line 128 to a first input 136 of comparator unit 28, and is conveyed via a line 130 to an input 34 of prediction unit 26.

The predicted value of the normalized average difference signal level $\Delta\hat{S}_{norm}$ is preferably determined according to the relationship:

$$\Delta\hat{S}_{norm} = \sum_{i=1}^{m} Y_i\Delta S_{norm}^{t-i} \quad \text{[Eq. 10]}$$

where m=4 and $Y_i$ are predefined constants. The four past scaled values of $\Delta S_{norm}$ are represented by $Y_i\Delta S_{norm}^{t-i}$ and are accumulated in prediction unit 26. Equation (10) may be executed employing an 8×16-bit parallel multiplier where the most significant 16-bits of the $\Delta S_{norm}$ parameter (in the 12-bit format described above) are applied to the 16-bit input of the multiplier and the $Y_i$ parameters are (prestored as 8-bit signed coefficients) applied to the 8-bit input of the multiplier. The output of the multiplier is preferably in the 12-bit format described above (and in $\log_2$ format).

Prediction unit 26 conveys the value of $\Delta\hat{S}_{norm}$ via a line 134 to a second input 38 of comparator unit 28. The apparatus by which prediction unit 26 calculates the value $\Delta\hat{S}_{norm}$ was discussed in connection with FIG. 3.

Comparator unit 28 calculates a prediction error parameter $E_t$, preferably in decibels (db), according to the relationship:

$$E_t = 10\log_{10}\frac{(\Delta S_{norm})^2}{(\Delta S_{norm} - \Delta\hat{S}_{norm})^2} \quad \text{[Eq. 11]}$$

This may be simplified to:

$$E_t = K_2(\log_2\Delta S_{norm} - \log_2[\Delta S_{norm} - \Delta\hat{S}_{norm}]) \quad \text{[Eq. 12]}$$

Execution of Equation (16) requires only two subtractions and two $\log_2$ functions, thus simplifying execution of Equation (16) by eliminating any division operations. $K_2=20\log_{10}2$, and is a constant which can be ignored in the preferred exemplary implementation.

The remainder of the preferred embodiment of the first signal processing means is constructed and operates in substantially the same manner as has been previously described in connection with FIGS. 1–3.

Figure 6:
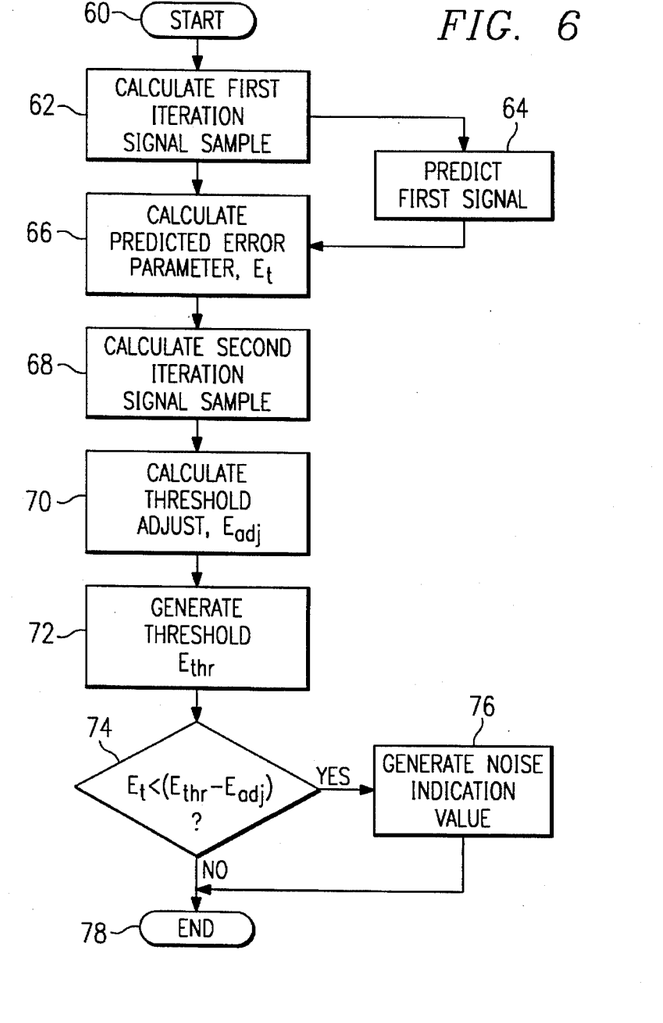
FIG. 6 is a flow diagram illustrating the preferred embodiment of the method of the present invention.

FIG. 6 is a flow diagram illustrating the preferred embodiment of the method of the present invention. In FIG. 6, the method starts at a block 60 with reception of incoming signal s (see FIG. 5).

At block 62, the first iteration signal sample is calculated. A plurality of first iteration signal samples is generated from the input signal. Each successive iteration signal sample represents a value of a first predetermined number of samples of a plurality of successive samples of the received signal. Preferably, the value of the first predetermined number is an average of the first predetermined number of successive samples of the received signal. Preferably, a moving average signal performs the calculations.

At block 64, a plurality of predicted first iteration signals is generated. Each successive predicted first iteration signal sample is used to predict a next successive first iteration signal sample.

At block 66, the first iteration signal samples calculated at block 62 and the predicted first iteration signal samples calculated at block 64 are compared. A prediction error parameter, designated $E_t$, is generated based upon the comparison. Preferably, the comparison involves a respective successive first iteration signal sample and a respective predicted first iteration signal sample which are substantially synchronous.

At block 68, a plurality of second iteration signal samples is calculated from the input signal. Each successive second iteration signal sample represents a value of a second predetermined number of samples of a plurality of successive samples of the received signal. Preferably, the second predetermined number of samples is greater than the first predetermined number of samples.

At block 70, a threshold adjustment value, $E_{adj}$, is calculated based upon selected second iteration signal samples. Preferably, a threshold adjusting means such as a look-up table responsive to the selected second iteration signal samples is provided.

At block 72, a threshold value is generated, and at block 74, a logic means is provided to determine whether to generate a noise indication according to a predetermined logical relationship among the prediction error parameter, the threshold adjustment value and the threshold value. Preferably, if $E_t < E_{thr} - E_{adj}$, the noise indication value is generated at block 76.

It is to be understood that, while the detailed drawing and specific examples given describe preferred embodiments of the invention, they are for the purpose of illustration, that the apparatus of the invention is not limited to the precise details and conditions disclosed and that various changes may be made therein without departing from the spirit of the invention which is defined by the following claims:

What is claimed is:

1. An apparatus for discriminating noise in a received signal, the apparatus comprising:
    a first signal processing means for receiving said received signal and determining a first level change of said received signal over a first time interval; said first signal processing means generating a prediction error parameter indicating said first level change;
    a second signal processing means for receiving said received signal and determining a second level change of said received signal over a second time interval; said second signal processing means generating a threshold adjustment value indicating said second level change; said second time interval being different from said first time interval;
    a threshold generating means for generating a threshold value; and
    a logic means operatively connected with said first signal processing means, with said second signal processing means, and with said threshold generating means for logically comparing said prediction error parameter, said threshold adjustment value, and said threshold value to generate a noise indication value when said comparing satisfies a predetermined relationship.

2. An apparatus for discriminating noise in a received signal, the apparatus comprising:
    a first signal processing means for receiving said received signal determining a first level change of said received signal over a first time interval and generating a predicition error parameter, said first signal processing means including first iteration processing means for receiving a first plurality of successive samples of said received signal and generating a first iteration signal, a prediction means operatively connected with said first iteration processing means for receiving said first iteration signal and predicting a next sample value of said first iteration signal and a comparing means operatively connected with said prediction means for comparing said first iteration signal with said prediction means for comparing said first iteration signal with said next sample value and generating said prediction error parameter;
    a second signal processing means for receiving said received signal determining a second level change of said received signal over a second time interval, and generating a threshold adjustment value;
    a threshold generating means for generating a threshold value; and
    a logic means operatively connected with said first signal processing means, with said second signal processing means, and with said threshold generating means for logically comparing said prediction error parameter, said threshold adjustment value, and said threshold value to generate a noise indication value when said comparing satisfies a predetermined relationship.

3. The apparatus for discriminating noise in the received signal as recited in claim 2 wherein said second signal processing means includes a second iteration processing means for receiving a second plurality of successive samples of said received signal and generating a second iteration signal responsive to said received signal and a threshold adjusting means operatively connected with said second iteration processing means for generating said threshold adjustment value responsive to said second iteration signal.

4. The apparatus for discriminating noise in the received signal as recited in claim 3 wherein said second iteration processing means receives the second plurality of successive samples of said received signal and generates a plurality of iteration signal samples, at least one successive iteration signal sample of said plurality of iteration signal samples representing a value of a predetermined number of said second plurality of successive samples of said received signal.

5. The apparatus for discriminating noise in the received signal as recited in claim 4 wherein said threshold adjusting means generates said threshold adjustment value in response to selected said successive iteration signal samples.

6. An apparatus for discriminating noise in a received signal, the apparatus comprising:
    a first signal processing means for receiving said received signal and generating a prediction error parameter;
    said first signal processing means including a first iteration processing means for generating a first iteration signal, a prediction means for predicting a next sample value of said first iteration signal, and a comparing means for generating said prediction error parameter;
    said first iteration processing means receiving a first plurality of successive samples of said received signal and generating a plurality of first iteration signal samples, at least one successive first iteration signal sample of said plurality of first iteration signal samples representing a value of first predetermined number of said first plurality of successive samples of said received signal;
    said prediction means being operatively connected with said first iteration processing means and receiving said plurality of first iteration signal samples and genrating a plurality of predicted first iteration signal samples; at least one successive said predicted first iteration signal sample of said pluralilty of predicted first iteration signal samples predicting a next said successive first iteration signal sample;
    said comparing means being operatively connected with said first iteration processing means and with said prediction means and comparing said successive first iteration signal samples with said predicted first iteration signal samples; said comparing means generating said prediction error parameter based upon said comparison;

a second signal processing means for receiving said received signal and generating a threshold adjustment value; said second signal processing means including a second iteration processing means for generating a second iteration signal and a threshold adjusting means for generating a threshold adjustment factor;

said second iteration processing means receiving a second plurality of successive samples of said received signal and generating a plurality of second iteration signal samples, at least one successive second iteration signal sample of said plurality of second iteration signal samples representing a value of a second predetermined number of said second plurality of successive samples of said received signal;

said threshold adjusting means being operatively connected with said second iteration processing means and generating said threshold adjustment value in response to selected said successive second iteration signal samples;

a threshold generating means for generating a threshold value; and a logic means operatively connected with said first signal processing means, with said second signal processing means, and with said threshold generating means for logically comparing said prediction error parameter, said threshold adjustment value, and said threshold value to generate a noise indication value.

7. An apparatus for discriminating noise in the received signal as recited in claim 6 wherein said value of said first predetermined number of said first plurality of successive samples of said received signal is an average of said first predetermined number of said first plurality of successive samples of said received signal.

8. An apparatus for discriminating noise in the received signal as recited in claim 6 wherein said comparing by said comparing means involves a respective said successive first iteration signal sample and a respective said predicted first iteration signal sample, said respective said successive first iteration signal sample and said respective said successive predicted first iteration signal sample being substantially synchronous.

9. An apparatus for discriminating noise in the received signal as recited in claim 6 wherein said second predetermined number is greater than said first predetermined number.

10. The apparatus for discriminating noise in the received signal as recited in claim 6 wherein said first iteration processing means comprises a moving average signal filter.

11. The apparatus for discriminating noise in the received signal as recited in claim 6 wherein said second iteration processing means comprises an auto-regressive signal filter.

12. The apparatus for discriminating noise in the received signal as recited in claim 6 wherein said threshold adjusting means comprises a look-up table responsive to said selected said second iteration signal samples for generating said threshold adjustment value.

13. The apparatus for discriminating noise in the received signal as recited in claim 6 wherein said logic means generates said noise indication value when said prediction error parameter is less than the difference between said threshold value and said threshold adjustment value.

14. The apparatus for discriminating noise in the received signal as recited in claim 6 wherein said first plurality of successive samples of said received signal and said second plurality of successive samples of said received signal are the same plurality of successive samples of said received signal.

15. The apparatus for discriminating noise in the received signal as recited in claim 7 wherein said value of said first predetermined number of said first plurality of successive samples of said received signal is an average of said first predetermined number of said first plurality of successive samples of said received signal.

16. The apparatus for discriminating noise in the received signal as recited in claim 15 wherein said comparing by said comparing means involves a respective said successive first iteration signal sample and a respective said predicted first iteration signal sample, said respective said successive first iteration signal sample and said respective said successive predicted first iteration signal sample being substantially synchronous.

17. The apparatus for discriminating noise in the received signal as recited in claim 16 wherein said second predetermined number is greater than said first predetermined number.

18. The apparatus for discriminating noise in the received signal as recited in claim 17 wherein said first iteration processing means comprises a moving average signal filter.

19. The apparatus for discriminating noise in the received signal as recited in claim 18 wherein said second iteration processing means comprises an auto-regressive signal filter.

20. The apparatus for discriminating noise in the received signal as recited in claim 19 wherein said threshold adjusting means comprises a look-up table responsive to said selected said second iteration signal samples for generating said threshold adjustment value.

21. The apparatus for discriminating noise in the received signal as recited in claim 20 wherein said logic means generates said noise indication value when said prediction error parameter is less than the difference between said threshold value and said threshold adjustment value.

22. A method for discriminating noise in a received signal, the method comprising the steps of:

(1) generating a first plurality of first iteration signal samples, at least one successive first iteration signal sample of said plurality of first iteration signal samples representing a value of a first predetermined number of samples of a first plurality of successive samples of said received signal;

(2) generating a second plurality of predicted first iteration signal samples, at least one successive said predicted first iteration signal sample of said plurality of predicted first iteration signal samples predicting a next said successive first iteration signal sample;

(3) comparing said successive first iteration signal samples with said predicted first iteration signal samples and generating a prediction error parameter based upon said comparison;

(4) generating a plurality of second iteration signal samples, at least one successive second iteration signal sample of said plurality of second iteration signal samples representing a value of a second predetermined number of said second plurality of successive samples of said received signal;

(5) generating a threshold adjustment value based upon selected said successive second iteration signal samples;

(6) generating a threshold value; and (7) providing a logic means for logically comparing said prediction error parameter, said threshold adjustment value, and said threshold value to generate a noise indication value according to a predetermined logical relationship among said prediction error parameter, said threshold adjustment value, and said threshold value.

23. The method for discriminating noise in the received signal as recited in claim 22 wherein said value of said first predetermined number of said first plurality of successive samples of said received signal is an average of said first predetermined number of said first plurality of successive samples of said received signal.

24. The method for discriminating noise in the received signal as recited in claim 22 wherein said comparing involves a respective said successive first iteration signal sample and a respective said predicted first iteration signal sample, said respective said successive first iteration signal sample and said respective said successive predicted first iteration signal sample being substantially synchronous.

25. The method for discriminating noise in the received signal as recited in claim 22 wherein said second predetermined number is greater than said first predetermined number.

26. The method for discriminating noise in the received signal as recited in claim 22 wherein the method further includes the step of providing a first iteration processing means for said generating said plurality of first iteration signal samples; said first iteration processing means comprising a moving average signal filter.

27. The method for discriminating noise in the received signal as recited in claim 22 wherein the method further includes the step of providing a second iteration processing means for said generating said plurality of second iteration signal samples; said second iteration processing means comprising an auto-regressive signal filter.

28. The method for discriminating noise in the received signal as recited in claim 22 wherein the method further comprises the step of providing a threshold adjusting means for generating said threshold adjustment value; said threshold adjusting means comprising a look-up table responsive to said selected said successive second iteration signal samples for said generating said threshold adjustment value.

29. The method for discriminating noise in the received signal as recited in claim 22 wherein said logic means generates said noise indication value when said prediction error parameter is less than the difference between said threshold value and said threshold adjustment value.

30. The method for discriminating noise in the received signal as recited in claim 22 wherein said first plurality of successive samples of said received signal and said second plurality of successive samples of said received signal are the same plurality of successive samples of said received signal.

31. The method for discriminating noise in the received signal as recited in claim 30 wherein said value of said first predetermined number of said first plurality of successive samples of said received signal is an average of said first predetermined number of said first plurality of successive samples of said received signal.

32. The method for discriminating noise in the received signal as recited in claim 31 wherein said comparing involves a respective said successive first iteration signal sample and a respective said predicted first iteration signal sample, said respective said successive first iteration signal sample and said respective said successive predicted first iteration signal sample being substantially synchronous.

33. The method for discriminating noise in the received signal as recited in claim 32 wherein said second predetermined number is greater than said first predetermined number.

34. The method for discriminating noise in the received signal as recited in claim 33 wherein the method further includes the step of providing a first iteration processing means for said generating said plurality of first iteration signal samples; said first iteration processing means comprising a moving average signal filter.

35. The method for discriminating noise in the received signal as recited in claim 34 wherein the method further includes the step of providing a second iteration processing means for said generating said plurality of second iteration signal samples; said second iteration processing means comprising an auto-regressive signal filter.

36. The method for discriminating noise in the received signal as recited in claim 35 wherein the method further comprises the step of providing a threshold adjusting means for generating said threshold adjustment value; said threshold adjusting means comprising a look-up table responsive to said selected said successive second iteration signal samples for said generating said threshold adjustment value.

37. The method for discriminating noise in the received signal as recited in claim 36 wherein said logic means generates said noise indication value when said prediction error parameter is less than the difference between said threshold value and said threshold adjustment value.

* * * * *